United States Patent
Witte et al.

(10) Patent No.: US 10,788,765 B2
(45) Date of Patent: Sep. 29, 2020

(54) METHOD AND APPARATUS FOR MEASURING A STRUCTURE ON A SUBSTRATE

(71) Applicant: ASML NETHERLANDS B.V., Veldhoven (NL)

(72) Inventors: Stefan Michiel Witte, Hoofddorp (NL); Alessandro Antoncecchi, Amsterdam (NL); Stephen Edward, Amsterdam (NL); Hao Zhang, Amsterdam (NL); Paulus Clemens Maria Planken, Jaarsveld (NL); Kjeld Sijbrand Eduard Eikema, Hoofddorp (NL); Sebastianus Adrianus Goorden, Eindhoven (NL); Simon Reinald Huisman, Eindhoven (NL); Irwan Dani Setija, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/478,068

(22) PCT Filed: Jan. 10, 2018

(86) PCT No.: PCT/EP2018/050514
§ 371 (c)(1),
(2) Date: Jul. 15, 2019

(87) PCT Pub. No.: WO2018/137925
PCT Pub. Date: Aug. 2, 2018

(65) Prior Publication Data
US 2019/0354026 A1    Nov. 21, 2019

(30) Foreign Application Priority Data

Jan. 25, 2017 (EP) .................................... 17153017
Nov. 20, 2017 (EP) .................................... 17202511

(51) Int. Cl.
| | | |
|---|---|---|
| *G03F 9/00* | (2006.01) | |
| *G01B 11/24* | (2006.01) | |
| *G01B 17/06* | (2006.01) | |

(52) U.S. Cl.
CPC ........ *G03F 9/7049* (2013.01); *G01B 11/2441* (2013.01); *G01B 17/06* (2013.01);
(Continued)

(58) Field of Classification Search
None
See application file for complete search history.

(56) References Cited

U.S. PATENT DOCUMENTS

| | | |
|---|---|---|
| 5,546,811 A | 8/1996 | Rogers et al. |
| 5,672,830 A | 9/1997 | Rogers et al. |

(Continued)

FOREIGN PATENT DOCUMENTS

| | | |
|---|---|---|
| EP | 1150173 | 10/2001 |
| EP | 1573267 | 9/2005 |

(Continued)

OTHER PUBLICATIONS

International Search Report and Written Opinion issued in corresponding PCT Patent Application No. PCT/EP2018/050514, dated Apr. 24, 2018.

(Continued)

*Primary Examiner* — J. E. Schoenholtz
(74) *Attorney, Agent, or Firm* — Pillsbury Winthrop Shaw Pittman LLP

(57) ABSTRACT

As increasing numbers of layers, using increasing numbers of specific materials, are deposited on substrates, it becomes increasingly difficult to detect alignment marks accurately for, for example, applying a desired pattern onto a substrate using a lithographic apparatus, in part due to one or more of the materials used in one or more of the layers being wholly (Continued)

or partially opaque to the radiation used to detect alignment marks. In a first step, the substrate is illuminated with excitation radiation. In a second step, at least one effect associated with a reflected material effect scattered by a buried structure is measured. The effect may, for example, include a physical displacement of the surface of the substrate. In a third step, at least one characteristic of the structure based on the measured effect is derived.

20 Claims, 11 Drawing Sheets

(52) U.S. Cl.
CPC .......... *G03F 9/7084* (2013.01); *G03F 9/7088* (2013.01); *G01B 2210/56* (2013.01)

(56) References Cited

U.S. PATENT DOCUMENTS

| | | | |
|---|---|---|---|
| 2002/0006560 A1* | 1/2002 | van der Schaar | G03F 9/7084 430/22 |
| 2006/0021438 A1 | 2/2006 | Klein et al. | |
| 2008/0123080 A1 | 5/2008 | Maznev | |

FOREIGN PATENT DOCUMENTS

| | | |
|---|---|---|
| JP | 2001267224 | 9/2001 |
| JP | 2002008974 | 1/2002 |
| JP | 2002508081 | 3/2002 |
| JP | 2002516985 | 6/2002 |
| JP | 2007147620 | 6/2007 |
| WO | 2004055476 | 7/2004 |

OTHER PUBLICATIONS

Maznev A., et al.: "Impulsive stimulated thermal scattering for sub-micron-thickness film characterization", Thin Solid Films, vol. 290-291, pp. 294-298, Dec. 15, 1996.

Ruello, Pascal, et al.: "Physical mechanisms of coherent acoustic honons generation by ultrafast laser action", Ultrasonics 56, pp. 21-35, 2015.

Matsuda, Osamu, et al.: "Fundamentals of picosecond laser ultrasonics", Ultrasonics 56, pp. 3-20, 2015.

Japanese Office Action issued in corresponding Japanese Patent Application No. 2019-538516, dated Jul. 16, 2020.

* cited by examiner (a)

(b)

(a)

(b)

METHOD AND APPARATUS FOR MEASURING A STRUCTURE ON A SUBSTRATE

CROSS REFERENCE TO RELATED APPLICATIONS

This application is the U.S. national phase entry of PCT Patent Application No. PCT/EP2018/050514, which was filed on Jan. 10, 2018, which claims the benefit of priority of European patent application no. 17153017.3, which was filed on Jan. 25, 2017, and European patent application no. 17202511.6, which was filed on Nov. 20, 2017, and which are incorporated herein in their entireties by reference.

FIELD

The present invention relates to methods and apparatus for measuring structures on a substrate, and in particular for measuring structures being located beneath at least one layer deposited on the surface of the substrate.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to control the lithographic process to place device features accurately on the substrate, one or more alignment marks are generally provided on, for example, the substrate, and the lithographic apparatus includes one or more alignment sensors by which the position of the mark may be measured accurately. The alignment sensor may be effectively a position measuring apparatus. Different types of marks and different types of alignment sensors are known from different times and different manufacturers.

Known alignment sensors use one or several radiation sources to generate a plurality of radiation beams with different wavelengths. In this fashion, a sensor may measure position using several wavelengths (e.g., colors) and polarizations of radiation (e.g., light) on the same target grating or gratings. No single color or polarization is ideal for measuring in all situations, so the system selects from a number of signals, which one provides the most reliable position information.

As increasing numbers of layers, using increasing numbers of specific materials, are deposited on substrates, it becomes increasingly difficult to detect alignment marks accurately. In part, this can be due to radiation having to propagate through increasing numbers of layers. Additionally, one or more of the materials used in one or more of the layers may be wholly or partially opaque to the radiation used to detect alignment marks. This may reduce the accuracy of alignment measurements or, in some examples, render alignment measurements impossible. This, in turn, may reduce the quality of the lithographic process and the functionality of the lithographic apparatus.

SUMMARY

According to a first aspect of the invention, there is provided a method for measuring a structure on a substrate, the structure being located beneath at least one layer deposited on the substrate, the method comprising:
  illuminating an excitation area of the substrate with excitation radiation at an excitation time, wherein the excitation radiation causes a material effect to interact with the substrate, and wherein the excitation radiation forms a spatial pattern on a surface of the substrate;
  measuring at least one effect associated with a scattered material effect scattered by the structure; and
  deriving at least one characteristic of the structure based on the at least one measured effect.

In an embodiment the step of measuring comprises illuminating the substrate with measurement radiation, and receiving scattered measurement radiation scattered by the substrate, wherein the scattered measurement radiation is representative of the at least one effect.

In an embodiment receiving scattered measurement radiation comprises using a detector, wherein the detector is one of: an interferometer; a darkfield detector; a differential detector; a lensless detection system; a single pixel detector; a phase contrast detector; or a CCD detector.

In an embodiment the excitation radiation comprises at least a first excitation beam, and wherein the step of illuminating the substrate with excitation radiation comprises using a radiation forming element so as to cause the at least first excitation beam to form the spatial pattern on a surface of the substrate. In a further embodiment the radiation forming element comprises a spatial optical modulator. In another further embodiment the radiation forming element comprises an interferometer.

In an embodiment the spatial pattern comprises one of: a one-dimensional spatially periodic pattern; a two-dimensional spatially periodic pattern; or a circularly symmetric periodic pattern.

In an embodiment the at least one effect on the surface of the substrate comprises at least one of: a physical displacement of the surface of the substrate; or a change in at least one optical property of the surface of the substrate, or a change in at least one physical quantity of the surface of the substrate. In a further embodiment the at least one effect is formed as a spatially periodic pattern on the surface of the substrate. In a further embodiment the at least one effect is a transient pattern on the surface of the substrate. In a further embodiment said transient pattern is a diffraction pattern of at least a portion of the structure. In a further embodiment the step of measuring comprises illuminating the substrate with measurement radiation at one or more predetermined time interval(s) from the excitation time, and receiving scattered measurement radiation scattered by the substrate at each one of the one or more predetermined time interval(s), wherein the scattered measurement radiation is representative of the transient pattern at respective one or more predetermined time interval(s). In an embodiment said transient pattern is a spatially period pattern. In an embodiment the substrate is illuminated with measurement radiation at one or more predetermined portion(s) of the excitation area. In an embodiment the excitation radiation is configured to generate a diffraction effect directly corresponding to a periodic pattern of the structure. In an embodiment the diffraction effect is the Talbot effect.

In an embodiment the material effect is an acoustic wave.

In an embodiment the material effect is a thermal diffusion. In an embodiment the material effect is a thermal diffusion of electron energy of the substrate. In a further embodiment the at least one effect is a diffusion contrast pattern of the electron gas energy on the surface of the substrate. In an embodiment the electron gas energy is an electron gas temperature.

In an embodiment the at least one characteristic of the measurement radiation may be chosen in dependency on one or more characteristics or material properties of at least one layer of the substrate.

The invention further provides a lithographic apparatus comprising means for performing a method as set out above.

The invention yet further provides a lithographic system comprising a lithographic apparatus as set out above.

The invention yet further provides a method of manufacturing devices, wherein device features are formed on a series of substrates by a lithographic process using a lithographic apparatus, and wherein properties of the substrates are measured using a method as set out above, and wherein the measured properties are used to adjust parameters of the lithographic process.

The invention yet further provides a computer program product containing one or more sequences of machine-readable instructions for implementing a method as set out above.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
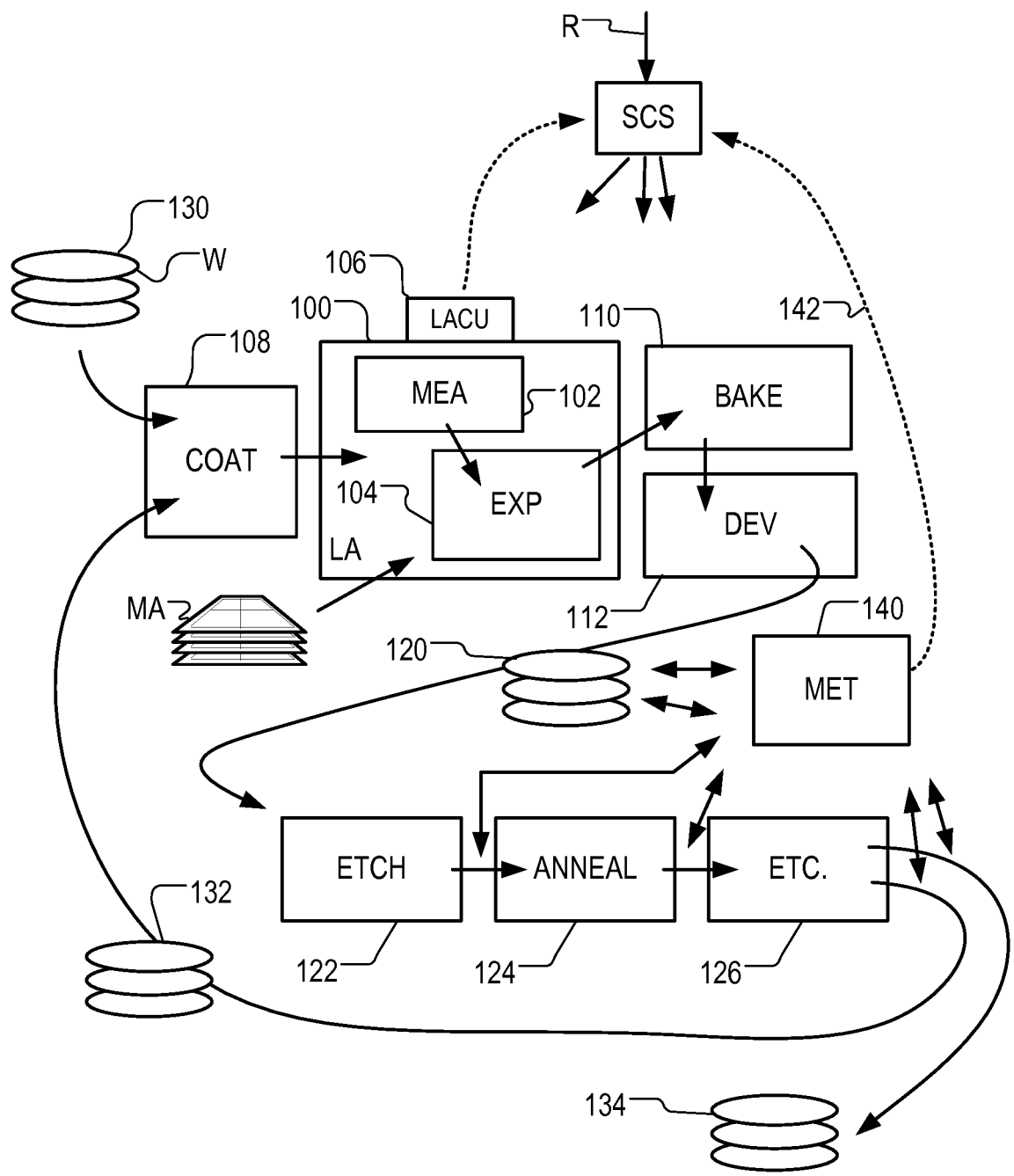
FIG. 1 depicts a lithographic apparatus together with other apparatuses forming a production facility for semiconductor devices.

FIG. 1 at 100 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or 'litho tool' 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term 'projection system' used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables WTa and WTb and two stations—an exposure station and a measurement station—between which the substrate tables can be exchanged.

Within the production facility, apparatus 100 forms part of a 'litho cell' or 'litho cluster' that contains also a coating apparatus 108 for applying photosensitive resist and other coatings to substrates W for patterning by the apparatus 100.

At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a "dry" tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit LACU 106 making small adjustments over time, thereby minimizing the risk of products being made out-of-specification, and requiring re-work. Of course, metrology apparatus 140 and/or other metrology apparatuses (not shown) can be applied to measure properties of the processed substrates 132, 234, and incoming substrates 130.

Figure 2:
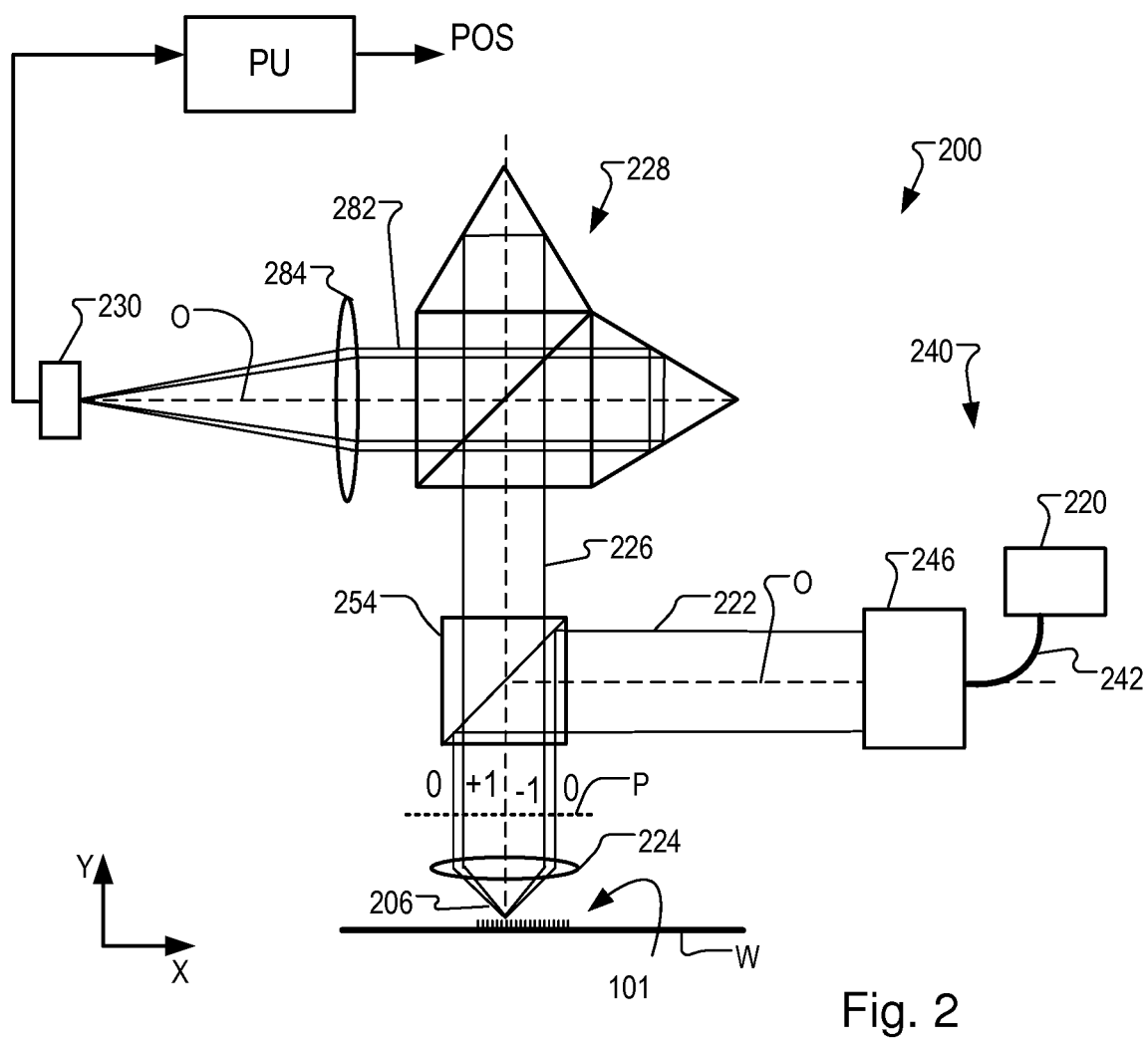
FIG. 2 shows an alignment sensor as used in the lithographic apparatus of FIG. 1.

FIG. 2 illustrates an optical system 200 of an exemplary alignment sensor. The exemplary alignment sensor utilizes off-axis illumination modes which, among other things, allow a reduced pitch of alignment mark for greater accuracy. The optical system may also allow scatterometry type measurements to be performed with the alignment sensor, rather than with a separate scatterometer instrument. In FIG. 2, for simplicity, the details of multiple wavelengths and polarizations are omitted. It will of course be appreciated that the illustrated alignment sensor is exemplary only, and that other implementations of alignment sensors may easily be envisaged.

An optical axis 'O' which has several branches is indicated by a broken line running throughout the optical system 200. The optical system comprises a radiation source 220, an illumination beam 222, an objective lens 224, an information carrying beam 226, a self-referencing interferometer 228 and a detector 230. In practice, any multiple detectors may in some examples be provided. Signals from the detector is processed by processing unit PU, which is modified so as to implement the features described below and to output a position measurement POS for each mark.

Additional components illustrated in this schematic diagram are as follows. In an illumination subsystem 240, radiation from source 220 is delivered via an optical fiber 242 to an illumination profiling optic 246. This delivers input beam 222 via beam splitter 254 to objective lens 224 having a pupil plane P. Objective lens 224 forms a spot 206 on alignment mark 101. Information-carrying beam 226, diffracted by the mark, passes through beam splitter 254 to interferometer 228. Interferometer 228 splits the radiation field into two parts with orthogonal polarization, rotates these parts about the optical axis by 180° relative to one another, and combines them into an outgoing beam 282. A lens 284 focuses the entire field onto a detector 230. The detector 230 in this example and in the alignment sensor are effectively single photodiodes and do not provide any spatial information except by the scanning motion described already. A detector having spatial resolution in a conjugate pupil plane can be added, to allow an angle-resolved scatterometry method to be performed using the alignment sensor hardware.

It should be noted that in the example shown in FIG. 2 some optical elements, e.g. beam shaping elements, used in practice have been omitted. This is only done to simplify the explanation of this idea. In a real implementation they may need to be included. Furthermore, in various examples, the optical system may comprise additional sub-systems (e.g. asymmetry measuring arrangement or the like). Any such elements or features, including their position within the optical system, may be envisaged by the skilled person.

In some processes, processing of layers on the substrate after the alignment mark has been formed leads to situations in which the marks cannot be found by the alignment sensor due to low or no signal strength. A low or zero signal strength can be caused for example by opaque layers on top of the marks which block the operation of the alignment sensor. This problem is becoming more common, as the number of layers on a typical substrate continues to increase. Furthermore, it is becoming increasingly common to use materials that are partially or wholly opaque to radiation typically used for alignment (or other types) of measurements.

Figure 3:
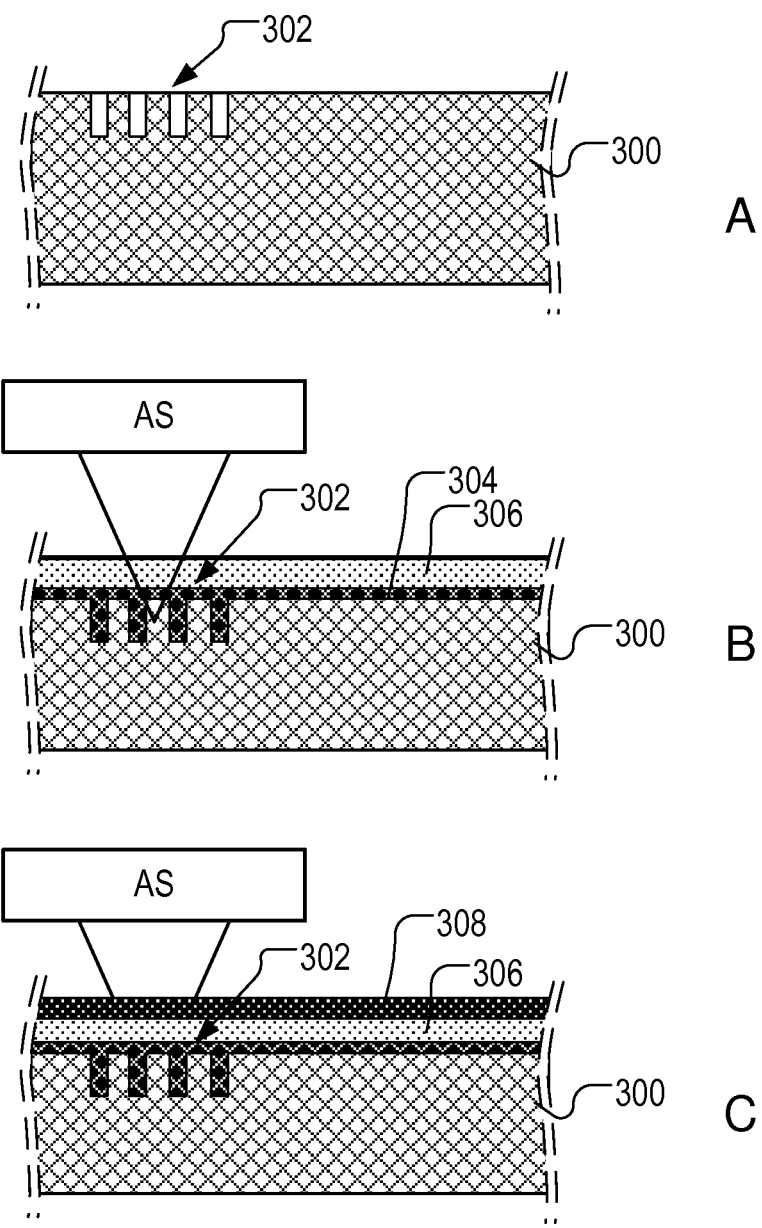
FIG. 3 depicts a structure buried beneath a number of layers deposited on a substrate.

FIG. 3 schematically illustrates the problem. A portion of the substrate is shown in cross-section at 300. It should be noted that the Figure is schematic only, and therefore not to scale. FIG. 3A shows the condition of the substrate when a grating structure has been formed to function as an alignment mark 302. It will be understood that this mark 302 is merely one of a plurality of marks present across the substrate. Different types of marks may be provided, to suit different sensors and/or different process conditions. Different marks may be provided for coarse position measurements and fine position measurements. Features defining the grating structure have been applied to the blank material of the substrate using the lithographic apparatus LA or a similar apparatus to form a pattern in a resist layer, and then chemically or physically etching the applied pattern to form trenches and so define the permanent grating structure in the blank material. These trenches may subsequently become filled with a material of another layer 304. The patterning to form the grating structure may be performed as part of a first layer processing of the substrate, in which the same patterning step also applies first layer device features. Alternatively, in some processes, it is preferable to form the alignment mark 302 in a dedicated step, which may be referred to as 'layer 0'.

As seen in FIG. 3B, alignment sensor AS in the lithographic apparatus can be used to detect the position of the mark 302, even as it becomes buried under overlying structures such as material layers 304 and 306. The known alignment sensors described in the references generally offer the capability to detect the position of the mark 302 using different wavelengths of radiation, so as to penetrate typical overlying structures. On the other hand, some materials used in the construction of the device may be opaque to any of the radiation available for use in the alignment sensor. In FIG. 3C, a particular layer 308 has been added. This may be, for example, a carbon hard mask layer. Layer 308 is applied in preparation for imparting a pattern to it, to form a functional layer of the device, or to form a hard mask for etching the layer below. However, layer 308 is opaque to the radiation of the alignment sensor AS, using the conventional range of wavelengths.

In case opaque layer 308 also does not leave any topographic features by which the mark may be found, accurate positioning of the pattern to define features in the opaque layer 308 becomes impossible without additional measures. For example, it is known to produce additional marks in subsequent layers to facilitate mark detection. However, the production of these additional marks is expensive. Some processes rely on the production of an optical window on top of the existing marks, in such a way that only the material which is located on top of the marks is removed and therefore the marks can be measured. The opening of the optical window allows alignment sensor AS to read the position of the mark 302, so that the lithographic apparatus can accurately position a subsequent pattern on the opaque layer 308. This optical window, also known as 'clear-out', needs to be done with a certain positional accuracy, otherwise die yield will be affected by cutting out parts of the layer which are needed to remain, in order to have for a functional device. By modifying the topography of the layer beneath the opaque layer 308, it is possible to provide alignment marks which can be read accurately enough to allow positioning of the clear-out windows. However, these also require additional processing steps and expense, thereby making this solution undesirable.

Figure 4:
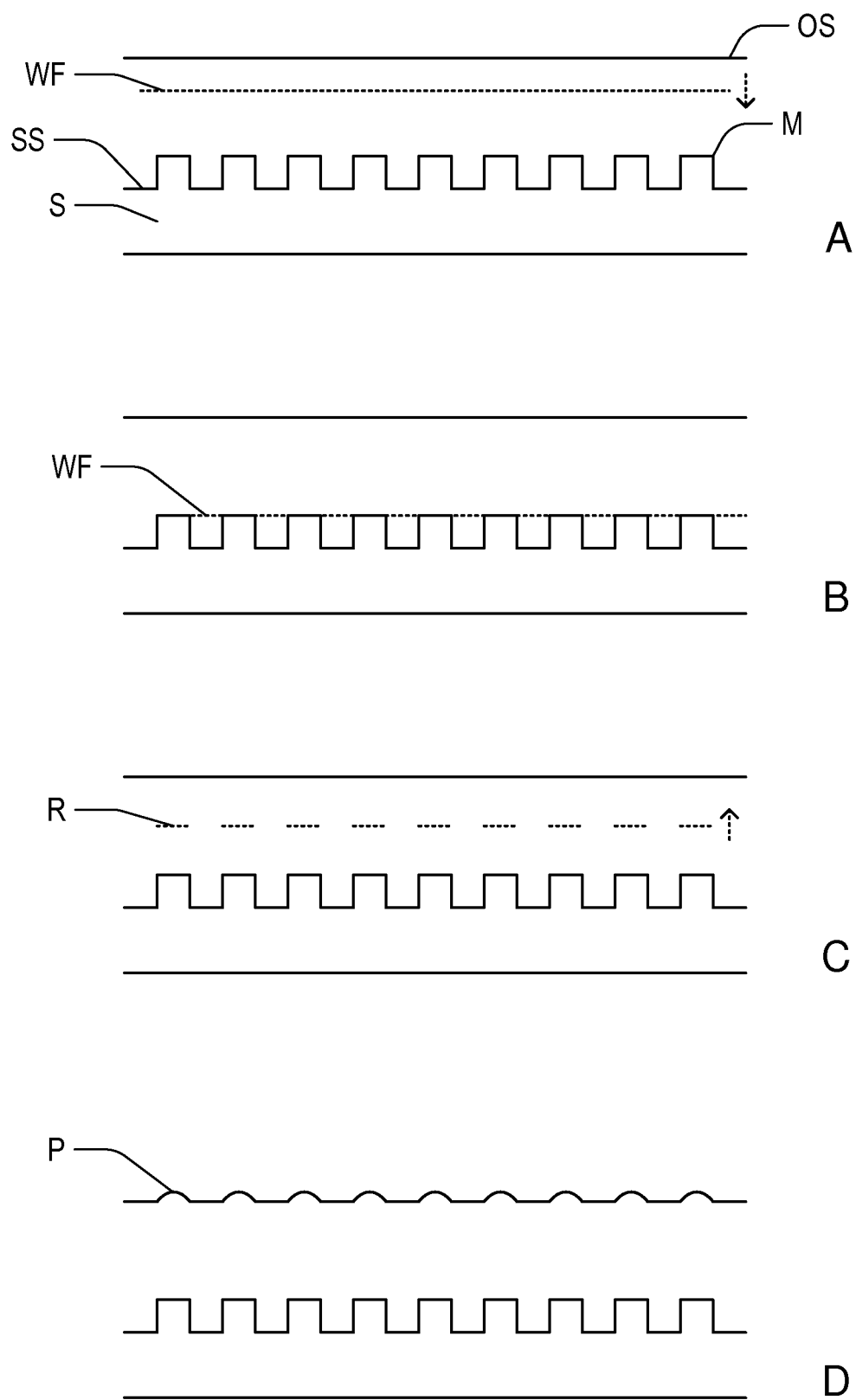
FIG. 4 illustrates a principle for revealing a buried structure.

An exemplary method for overcoming the above problem will now be described with reference to FIG. 4. A mark M, such as an alignment or positioning mark, has been deposited on a substrate S with a surface SS. Subsequently, one or several layers have been deposited on top of the mark. One or more of these layers may be partially or fully opaque to radiation used in an alignment or position measurement, such as described above.

First, an outer surface OS of a deposited layer (or layers) covering the mark M is excited using suitable radiation, such as a short pulse laser, over the whole area of the buried mark M. This generates a wavefront WF, e.g. an acoustic wavefront, which propagates downwards through the deposited layers covering the mark (indicated by the arrow), as shown in FIG. 4A. When the wavefront WF meets the level of the top of the buried mark M, as shown in FIG. 4B, reflections will be generated only in the areas where the mark is raised. Thus the reflection R which returns towards the outer surface OS will carry an image of the buried mark, as shown in FIG. 4C. It is to be noted that, in reality, reflections may additionally be generated by the wavefront meeting the surface SS. These reflections arrive at the outer surface OS after a time delay relative to the reflections from the raised portions of the mark, the time delay being dependent on the dimensions of the mark M. In some examples, the alignment may be performed using these reflections as an alternative, or additional to, the reflections from the raised portions of the mark M.

When the reflection R reaches the outer surface OS, as shown in FIG. 4D, the surface will be displaced and/or the reflectivity of the outer surface will be changed in a pattern P corresponding to the buried mark M. The displacements and the difference in reflectivity between the displaced and not-displaced areas of the surface form effectively form a diffraction grating that diffracts the alignment beam in the same way as the mark M itself. An alignment can then be carried out to the acoustic representation of the buried mark M.

Figure 5:
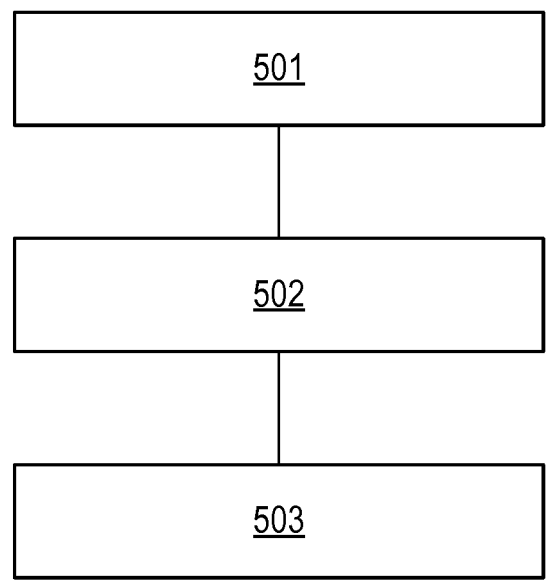
FIG. 5 depicts a method for revealing a buried structure in accordance with the invention.
Figure 6:
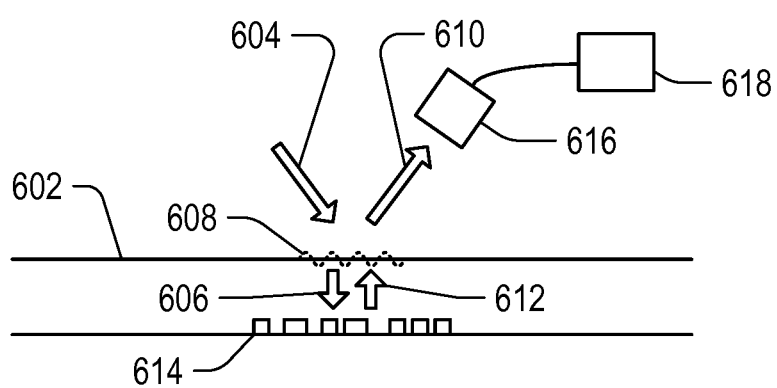
FIG. 6 schematically illustrates an apparatus in which the method of FIG. 5 may be implemented.

An exemplary method and apparatus for measuring a structure on a substrate in accordance with the present disclosure will now be discussed with reference to FIGS. 5 and 6. The structure is located beneath at least one layer deposited on a surface of the substrate. It is to be noted, however, that although only a single layer is illustrated in the present example, the method is equally well usable for substrate with a plurality of deposited layers.

In a first step 501, the substrate 602 is illuminated with excitation radiation 604. The excitation radiation forms a spatial pattern 608 on a surface of the substrate. The excitation radiation causes a material effect 606 to propagate through the substrate. The material effect may take any suitable form and may be generated in any suitable fashion by the excitation radiation. In an example, the material effect is an acoustic wave. In another example, the material effect is a thermal diffusion, for example a thermal diffusion of electron energy of the substrate. In an example, as previously described, the excitation radiation is a short laser pulse delivered by a suitable laser source. It will be appreciated that the material effect is dependent on one or more characteristics of the excitation radiation and/or the one or more layers on the substrate. It will further be appreciated that whilst the term 'surface' has been used above, and will be in the following, the excitation radiation may in some examples excite a volume of material. Similarly, in some examples, subsequent measurement steps may also, in some examples, interact with a volume of material rather than interact only with a surface.

The excitation radiation may form any suitable spatial pattern on the surface of the substrate. In some examples, the spatial pattern comprises one of: a one-dimensional spatially periodic pattern; a two-dimensional spatially periodic pattern; or a circularly symmetric periodic pattern. It will be appreciated that any suitable spatial pattern may be employed. In some examples, a specific spatial pattern may be employed to generate a particular material effect with one or more beneficial characteristics.

The spatial pattern may be generated in any suitable fashion. In some examples, the excitation radiation comprises at least a first excitation beam, and may be generated by using a radiation forming element so as to cause the spatial pattern to be formed on the surface of the substrate. In an example, the excitation radiation comprises a first excitation beam and a second excitation beam, and the spatial pattern is formed as an interference pattern between the first excitation beam and the second excitation beam. In another example, the excitation radiation comprises a first excitation beam, and the radiation forming element comprises a spatial optical modulator.

In a second step 502, at least one effect 610 associated with a reflected material effect 612 scattered by a structure 614 is measured. The effect may be measured in any suitable fashion using a suitable detector 616. As described above, in some examples, the effect comprises a change in refractive index at the surface of the substrate. In other examples, the effect comprises a physical displacement of the surface of the substrate. In yet other examples, the effect comprises both a change in refractive index and a physical displacement. It will be realized that the effect is, in at least some examples, dependent on the reflected material effect and/or one or more characteristics of one or more layers of the substrate.

Any suitable type of measurement and/or detector may be used to carry out the measurement step. In some examples, the detector is one of: an interferometer; a darkfield detector; a differential detector; a lensless detection system; a single pixel detector; a phase contrast detector; or a CCD detector. It will be appreciated that the specific type or types of measurement, as well as the type of detector, employed to measure the effect is, in some examples, dependent on the characteristics of the effects under measurement. For example, if the effect comprises a change in refractive index, the effect may be measurable as a change in reflectivity of the surface of the substrate. In another example, if the effect comprises a physical displacement, the measurement may be measurable as a phase shift. In other examples, the effect may comprise both a change in refractive index and a physical displacement. A number of exemplary measurement methods and apparatuses will be discussed in more detail below.

In a third step 503, at least one characteristic of the structure based on the at least one measured effect is derived. The derivation step may be carried out in a suitable fashion. In an example, the derivation step is performed by a processing unit 618.

Figure 7:
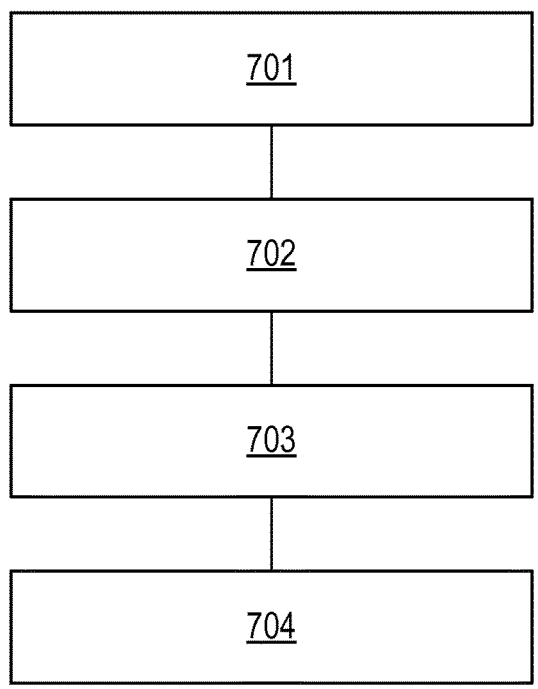
FIG. 7 illustrates a specific method in accordance with a second aspect of the invention.
Figure 8:
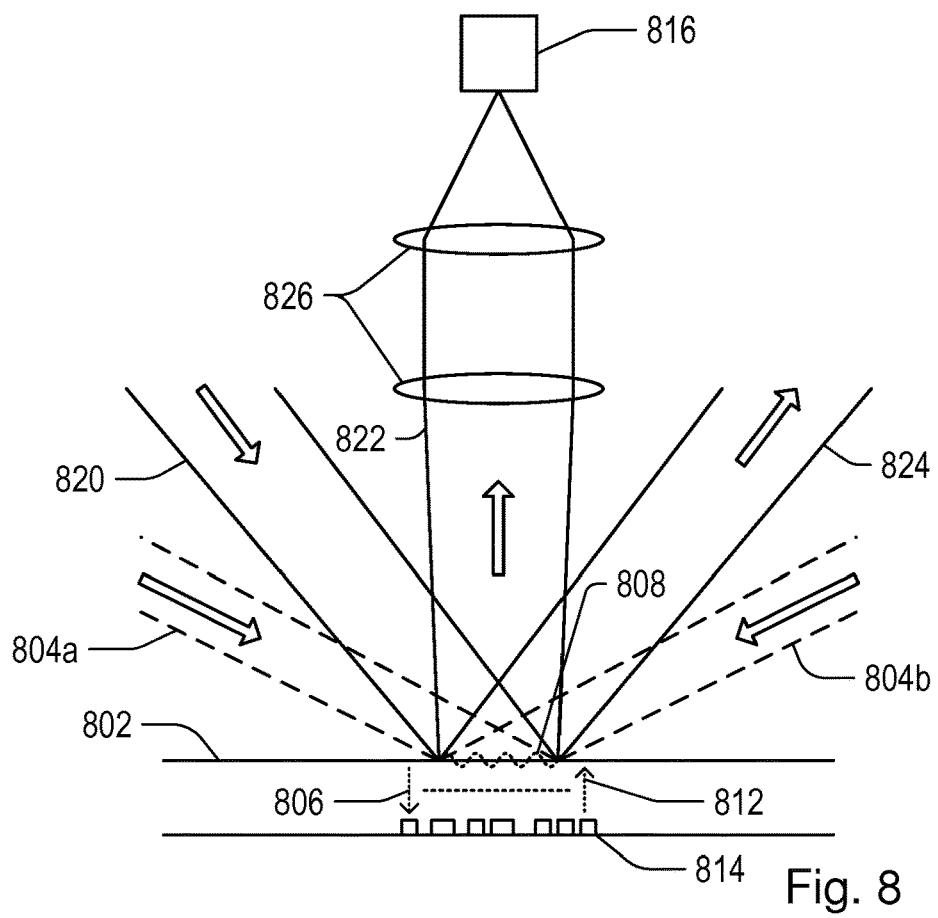
FIG. 8 illustrates an apparatus in which the method of FIG. 7 may be implemented.

A first specific exemplary implementation of a measurement method, as well as an apparatus in which it may be implemented, will now be discussed with reference to FIGS. 7 and 8. It will be appreciated that the specific implementations discussed in the following are merely exemplary and not in any way intended to be limiting the scope of the present disclosure. It will also be appreciated that a number of specific implementations that may be implemented in an apparatus such as described with reference to FIG. 2 above may be envisaged. Further, for ease of comparison with FIG. 6, elements of FIG. 8 similar to corresponding elements of FIG. 6 are labelled with reference signs similar to those used in FIG. 6, but with prefix '8' instead of '6'.

In a first step, 701, a substrate 802 is illuminated with excitation radiation 804a, 804b. The excitation radiation forms a spatial pattern 808 on a surface of the substrate. The excitation radiation causes a material effect 806 to propagate through the substrate. It is to be noted that the schematic representation of the spatial pattern as a linear sinusoid is for exemplary purposes only, as discussed in further detail below.

The excitation radiation may be provided in any suitable fashion. In the present example, the excitation radiation comprises a first excitation component 804a and a second excitation component 804b. The first excitation component and the second excitation component are directed towards the surface of the substrate, thereby to form the spatial pattern on the surface of the substrate. It will be realized that, while only two excitation components are shown in FIG. 8, any suitable number of excitation components may be used.

Any suitable spatial pattern may be used. It will be realized that specific implementation of the spatial pattern may be dependent on the excitation radiation and the manner in which it is provided. In some examples the spatial pattern comprises one of: a one-dimensional spatially periodic pattern; a two-dimensional spatially periodic pattern; or a circularly symmetric periodic pattern. In an example, the spatial pattern is a periodic linear interference pattern. It will be appreciated that the pattern may be formed to be matched to at least one of the characteristics of the structure.

In a second step 702, the substrate is illuminated with measurement radiation 820. Any suitable measurement radiation may be used. In some examples, one or more characteristics of the measurement radiation may be chosen in dependency on one or more characteristics or material properties of at least one layer of the substrate. In an example, the measurement radiation is optimized so as to maximize the amount of radiation scattered by the substrate. The measurement radiation may be delivered in any suitable fashion by a suitable illumination system (not shown). In some examples, the illumination system of the present disclosure may share one or more optical components with at least one other optical system of an apparatus (e.g. a lithographic apparatus).

In a third step 703, scattered measurement radiation 822 that has been scattered by the substrate is received, wherein the scattered measurement radiation is representative of the at least one effect. As described above, one or more characteristics of the scattered measurement radiation will be modified by a surface effect. Dependent on the measurement method employed as well as the properties of the illumination radiation, additional scattered radiation 824 may be generated. In some examples, the scattered radiation is separated into a plurality of diffraction orders, of which only one specific diffraction order may be utilized for a particular measurement. Any additional scattered radiation may be dealt with in an appropriate manner. In some examples, the additional scattered radiation may be used in additional or alternative measurements. In other examples, the additional scattered radiation may be blocked or diverted towards a beam dump (not shown).

The scattered measurement radiation may be received in a suitable fashion at a detector 816. Any suitable type of detector may be used, such as a CCD detector. The choice of detector may be dependent on the type of radiation employed in the measurement. In addition to the detector any suitable number of optical components 826 may be provided, for example to shape or optimize the scattered radiation. The detector may be arranged to detect a specific subset of the scattered radiation. In some examples, wherein the scattered radiation is scattered into a plurality of diffraction orders scattered at the surface of the substrate, the detector is arranged to receive '+1' order diffracted radiation. In other examples, '0' order diffracted radiation may be received by the detector. In yet other examples, '-1' order diffracted radiation may be received by the detector. In yet other examples, the detector may be arranged to receive a combination of diffraction orders.

In a fourth step 704, at least one characteristic of the structure based on the at least one measured effect is derived. As discussed above, the derivation may be performed in any suitable fashion, e.g. by a processing unit (not shown) connected to the detector. Subsequently, the derived characteristic may be used in a suitable fashion, for example to control deposition of further layers in a lithographic apparatus.

Figure 9:
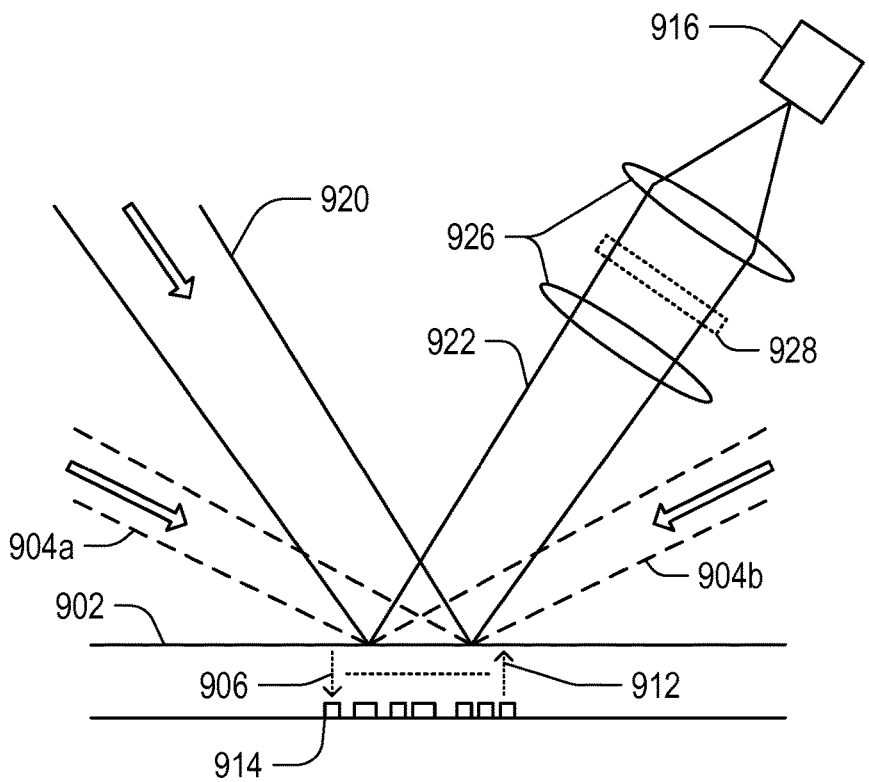
FIG. 9 illustrates an apparatus for revealing a buried structure in accordance with a third aspect of the invention.

A second specific exemplary implementation of a measurement apparatus in which the above-discussed method may be implemented, will now be discussed with reference to FIG. 9. For ease of comparison with FIG. 8, elements of FIG. 9 similar to corresponding elements of FIG. 8 are labelled with reference signs similar to those used in FIG. 8, but with prefix '9' instead of '8'. For purposes of conciseness, only the features that differ from those described with reference to FIG. 8 will be described in detail in the following.

In this exemplary implementation, the scattered radiation 922 comprises radiation that has been directly scattered by the substrate 902 (e.g. specular reflection). The scattered radiation 922 is received at detector 916.

In this example, the excitation radiation 904a, 904b is provided by a pair of laser radiation sources with a very short pulse time. The excitation radiation generates a spatial pattern on the surface of the substrate 902. This spatial pattern disappears after a very short period (typically measurable in ps, i.e. picosecond). In turn, the spatial pattern generates the material effect (e.g. an acoustic wave) that is reflected by the structure 914 as described in the preceding examples.

The material effect generates an effect that is measured by illuminating the substrate with measurement radiation 920. In the present example, the effect comprises a modulation of the scattered measurement radiation signal 922 as received at the detector 916.

In some examples, in addition to the detector, any suitable number of optical components 926 may be provided, for example to shape or optimize the scattered radiation 922. In specific examples, one or more further additional optical components 928 (e.g. a beam blocking element, an attenuating element, or a phase-delay element) may be comprised in the optical system.

Another exemplary method and apparatus for measuring a structure on a substrate in accordance with a fourth aspect of the present invention will now be discussed with reference to FIGS. 10 to 12. The structure 1014 is located beneath at least one layer deposited on a surface of the substrate. It is to be noted, however, that although only a single layer is illustrated in the present example, the method is equally well usable for substrate with a plurality of deposited layers.

As is known from the prior art, acoustic waves can be used to detect structures hidden below optically opaque layers such as metals. This concept may be useful for alignment, CD (critical dimensions) and other forms of wafer metrology through thick multilayer stacks of various materials commonly encountered in lithography, provided that the required resolution and sensitivity can also be met.

Furthermore, it is known that ultrafast lasers can generate acoustic waves inside different materials (see, for example, Ruello et al., Ultrasonics 56, 21(2015)). So, in the last few years, excitation-measurement methods have been used to detect laser-generated acoustic waves (AW). The acoustic waves may give rise to two effects that are observable with optical methods, (1) the propagating strain causes a displacement of the metal lattice, and (2) the stress related to the acoustic waves induces changes of the dielectric constant via photo-elastic effects (see, for example, Matsuda et al., Ultrasonics 56, 3(2015)). The scanning of the delay time between excitation and measurement pulses while measuring the reflection of the measurement beam returns an oscillating signal, which reveals the propagation of acoustic waves through the sample.

It is further known that optical metrology is limited in resolution by the diffraction limit, which is determined by the numerical aperture (NA) of the detection system and the wavelength of the light. While alignment and overlay may still achieve sub-nanometer position resolution through the use of repetitive structures, such as gratings 1014, the pitch of the markers that can be used is limited by the optical diffraction limit. Having higher spatial resolution beyond the optical diffraction limit would enable the use of at-resolution metrology targets or even on-device alignment and overlay, and have large advantages for optical CD metrology.

So, in the fourth aspect of the present invention optically induced acoustic waves are utilized to "see" through opaque layers (e.g. metal layers). In particular, the acoustic reflections of structures 1014 below one or more layers return to the surface 1002 and are detectable by optical means as they displace the surface 1002 and modify, for example, the refractive index of that material. The optically induced acoustic waves (AW) may have wavelengths in the region of 10-100 nm that, in principle, allow a much higher resolution than optical methods.

The fourth aspect of the present invention may achieve a spatial resolution in the 10-50 nm range, making it useful for CD metrology and mask defect inspection. Furthermore, more complex tasks, such as edge placement error, may be considered, as the fourth aspect of the method of the present invention does not require repetitive structures to achieve this resolution. Also, it enables the use of smaller pitch targets for alignment applications.

In the fourth aspect of the invention a diffraction pattern 1010 of the acoustic waves 1012 is optically detected at the surface 1002. In case a far-field acoustic diffraction pattern of a returning acoustic wave 1012 can be detected, the resolution of the structure 1014 may be determined by the acoustic Numerical Aperture (NA) of the diffraction pattern 1010, i.e. the maximum detected diffraction angle of the acoustic signal, and the acoustic wavelength, and not by the resolution of the optical detection system.

Figure 10:
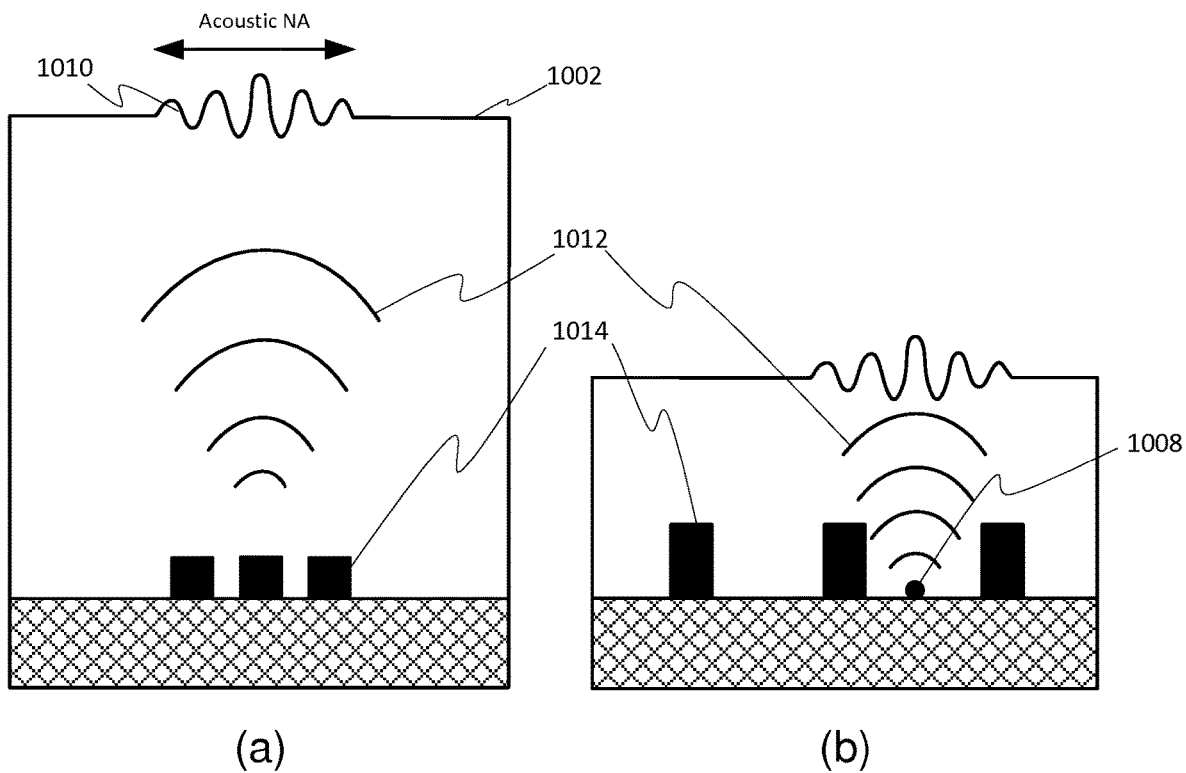
FIG. 10 illustrates a principle of a fourth aspect of the invention utilizing an acoustic diffraction pattern to reveal the buried structure, (a) illustrates a far-field diffraction pattern at the surface, and (b) illustrates acoustic scattering on a defect.

The concept of the fourth aspect of the present invention is shown in FIG. 10 (a), (b), where an acoustic echo 1012 is reflected from a set of buried nanostructures 1014 and returns to the surface 1002 through a layer of, for example, metal. As mentioned above, diffraction of the acoustic waves 1012 gives rise to a far-field diffraction pattern 1010 at the surface 1002. As shown in FIG. 10 (b), a defect 1008 with a size comparable to the acoustic wavelength (e.g. 10-100 nm) may cause significant acoustic scattering that is detectable at the surface 1002.

Relevance of the diffraction may be quantified by the Fresnel number $F=a^2/(L\lambda)$, where 'a' is the dimension of the diffracting object, 'L' is the propagation distance and $\lambda$ is the wavelength. When 'F'<<'1', the diffraction is said to be in the far-field, while for F>>'1', diffraction may not be significant and an image of the object is observed. For the case of nanostructures (e.g. 'a'<100 nm), e.g. a typical layer thickness of 1 μm and wavelengths in the region of 10-100 nm, far-field diffraction is expected to be the relevant regime.

Figure 11:
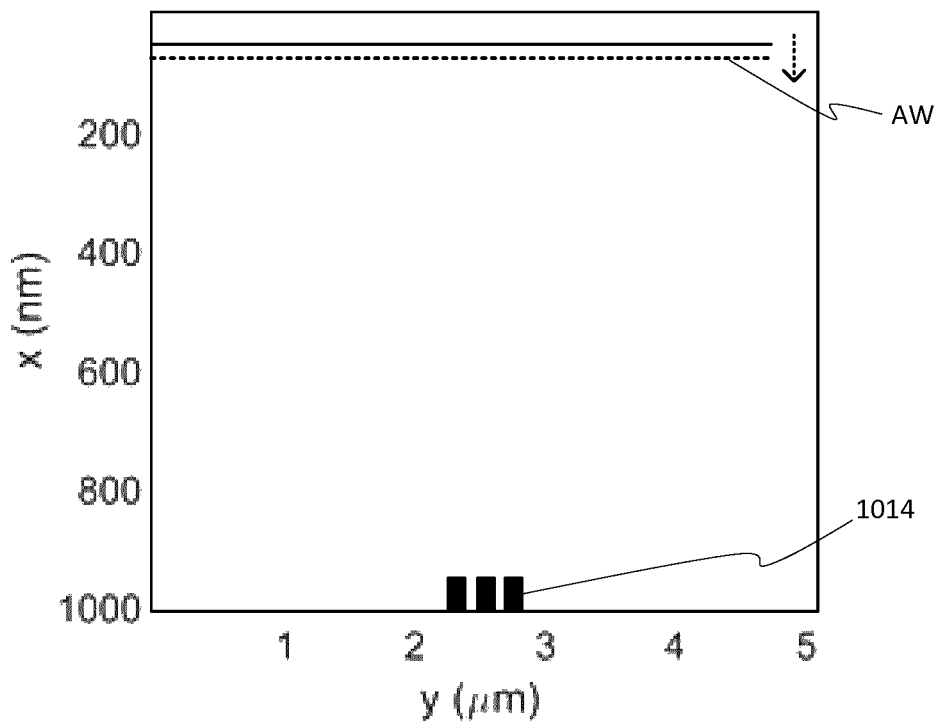
FIG. 11 shows a simplified illustration of a simulation of the acoustic wave propagation in a 1 µm thick gold layer for acoustic wavepacket with central wavelength of 100 nm, (a) an incident acoustic plane wave is propagating towards the nano-sized structure, and (b) after reflection and diffraction of the acoustic waves, showing a far-field diffraction pattern rather than a direct image of the structure.
Figure 11:
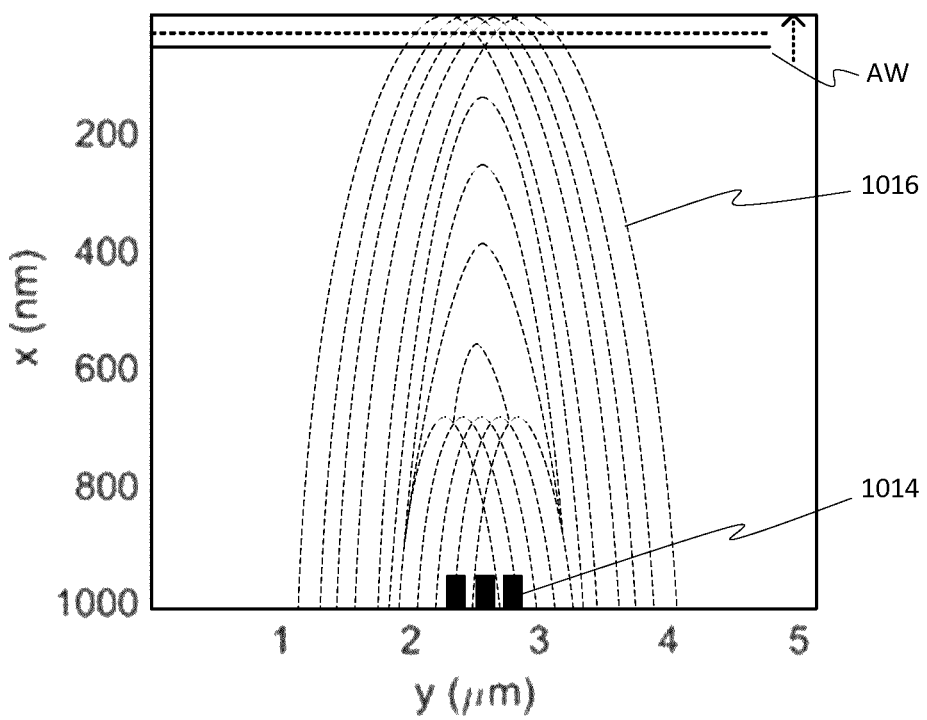

FIG. 11 shows and illustration of the displacement field (i.e. acoustic response) inside a sample at two different time instants, (a) before and (b) after reflecting from a buried nanostructure 1014. It is shown that, when the diffraction 1016 of the acoustic waves (AW) return, the displacement at the surface does not resemble the topography of the buried object 1014, but shows a modulation, which is the result of the diffraction 1016 of the acoustic wave (AW).

An important aspect of the fourth aspect of the present invention is that the time evolution of the acoustic diffraction pattern (i.e. the transient nature) is measured by recording a series of images as a function of the time delay between the excitation beam and the measurement beam. As illustrated in FIG. 11(b), diffracted waves 1016 emerge from the structure at different angles, so the detection of the higher angle components require a longer time delay from the excitation. In order to record a high-NA pattern, a time delay between excitation and measurement in the order of several nanoseconds may be required. This may be realized, for example, with a mechanical delay line or suitable electronic methods.

A reconstruction algorithm retrieves the object (i.e. structure) from the available acoustic diffracted field 1016. Since amplitude and/or phase of this field may be measured, this may be achieved using Fourier-transform methods (in case of far-field diffraction), or wave-propagation-based methods for near-field (Fresnel) diffraction. For example, an image of the buried object (i.e. structure 1014) may be reconstructed numerically if phase and amplitude of the acoustic wave (AW) at the surface are measured, utilizing an inverse propagation algorithm utilizing information of the layers and the measured acoustic field as input.

(i) Example

For an opaque layer of 5 μm thickness, optical detection of the returning acoustic echo over an area of 10×10 μm leads to an NA of 0.5. This allows a spatial resolution of $R=\lambda/2NA=20$ nm for an acoustic wavelength of 20 nm. The resolution of the optical detection system determines the sampling density of the diffraction pattern, which determines the field-of-view of the reconstructed image. For an optical resolution of 200 nm, the described geometry may provide an image size of '1×1' μm that is subdivided into 50×50 pixels.

Figure 12:
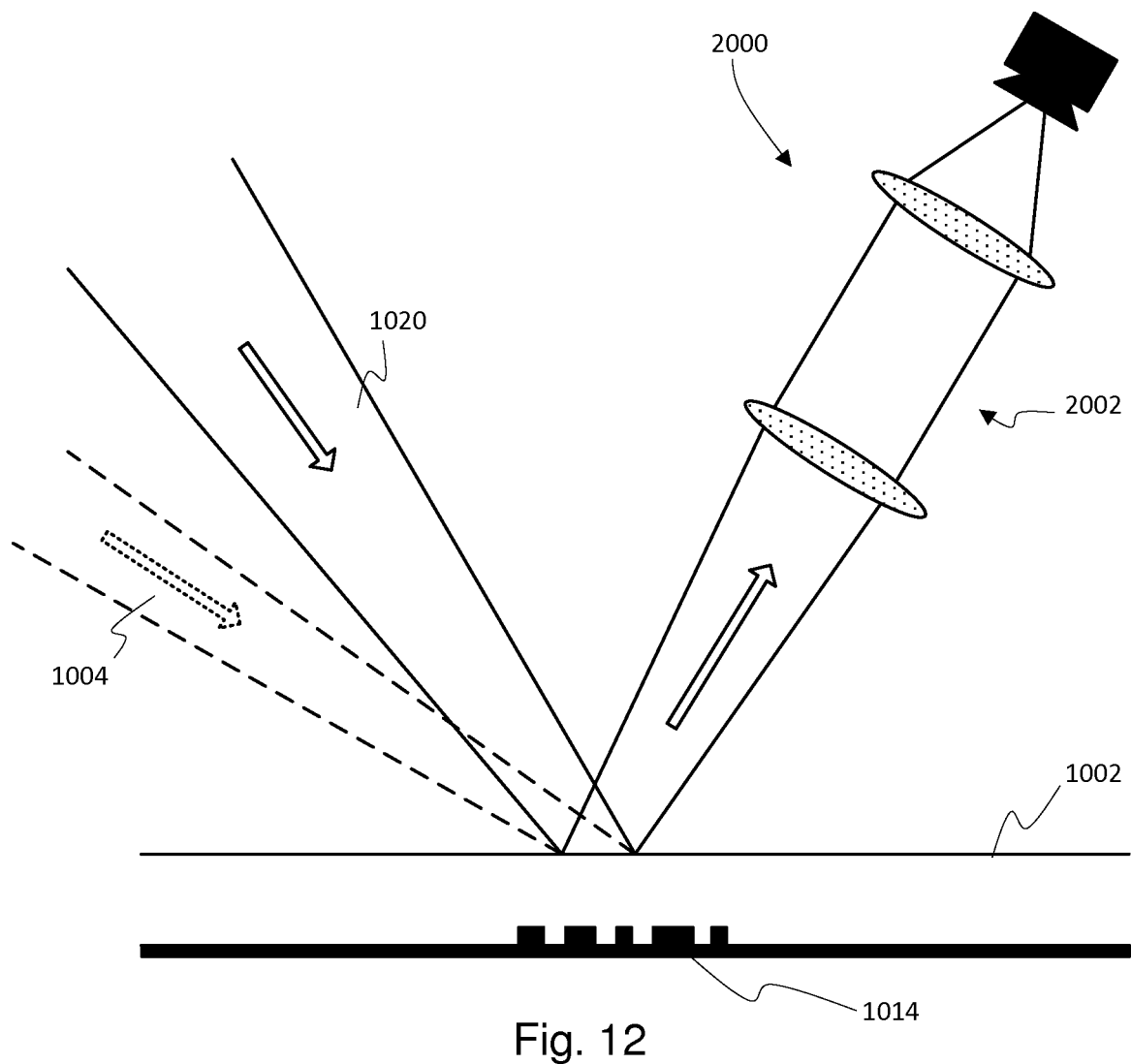
FIG. 12 schematically illustrates an apparatus, in which the method of the fourth aspect of the invention may be implemented.

FIG. 12 illustrates an example embodiment of an excitation-measurement system 2000 and a setup for detection of sub-surface structures 1014 below an optically opaque layer 1002. An excitation pulse 1004 launches an acoustic wave in the opaque layer 1002, and a time-delayed measurement pulse 1020 detects the returning echo. An optical imaging system 2002 retrieves the spatial structure of the diffraction pattern. For far-field acoustic diffraction patterns, the NA of the optical system 2000 determines the field of view of the reconstructed buried object (i.e. structure 1014).

(ii) Example—First Alignment Embodiment

The target is a known grating 1014, therefore, distinct acoustic diffraction orders can be expected at pre-defined angles.

A suitable system may comprise:
(1) a pump-probe system 2000 for photoacoustic generation and detection,
(2) high-NA spatially resolved detection at a few (typically two) pre-defined locations around the excitation spot (area on surface),
(3) an optical system 2002 that can detect phase differences between the two diffraction orders, and
(4) alignment sensor electronics and algorithms.

The suitable detection system now only needs to resolve the $+/-1^{st}$ acoustic diffraction orders that are returning to the surface. In case of far-field diffraction, those diffraction echoes can be spatially separated from the excitation spot position (see example below). A time-delayed measurement is still required due to the time difference between the excitation and the returning echo. Though, with a known layer thickness, detection can be done with a limited excitation-measurement time delay scan around a known time delay corresponding to the first diffraction orders.

This provides the advantage of a sensitivity to smaller grating pitches compared to optical alignment. For example, a 50 nm acoustic wave incident on a grating with 50 nm lines may result in a first order diffraction at a 30 degree angle. For a 1 μm thick layer the returning echo may be displaced by 0.58 μm at the surface, and arrives at an excitation-measurement delay time of about 360 ps (exact timing depends on the speed of sound in the opaque layer). With a tightly focused excitation spot (area on surface), such returning diffraction spots can be spatially resolved.

(iii) Example—Second Alignment Embodiment

The grating 1014 is extended and illuminated by a larger excitation spot, and the returning acoustic field will also form a spatially extended diffraction pattern. Depending on the acoustic wavelength, layer thickness and material, the Talbot effect may be exploited to produce a grating-like diffraction pattern at the surface 1002. The pitch and phase of this diffraction pattern may be directly linked to the buried grating (i.e. structure 1014), so alignment may be performed on the diffracted grating. For some parameters, the Talbot effect may lead to a surface grating with a pitch that can be two to four times smaller than the pitch of the buried grating (i.e. structure 1014).

To realize the second alignment embodiment, the system may requires:
(1) a pump-probe system for photoacoustic generation and detection,
(2) a SMASH-like sensor (Smart Alignment Sensor Hybrid, ASML) for detection of the diffracted grating.

Detection of the diffracted acoustic grating may be performed at a fixed excitation-measurement time delay.

For any of the embodiments of the fourth aspect of the invention, it is understood by the person skilled in the art that multiple or shaped excitation pulses may be used to modify the acoustic excitation spectrum, e.g. to have a more monochromatic acoustic wave. Further, the associated acoustic frequencies may be in the hundred GHz range, so the acoustic field can be sampled directly with the excitation-measurement scan (no interferometry needed). Also, it is understood that the achievable resolution will in practice depend on the attenuation of the acoustic waves (AW), and, since the high-angle diffraction travels a longer distance than the specular reflection, the high-k components may be attenuated more, effectively limiting the acoustic NA. Further, acoustic waves (AW) may also be launched in optically transparent surface layers, using wavelengths in the infrared or extreme ultraviolet range. In addition, 't' detection step can potentially also be done with an atomic force microscope (AFM), giving improved sampling of the diffraction pattern. But optical access for the pump beam may potentially be problematic in such an embodiment.

Figure 13:
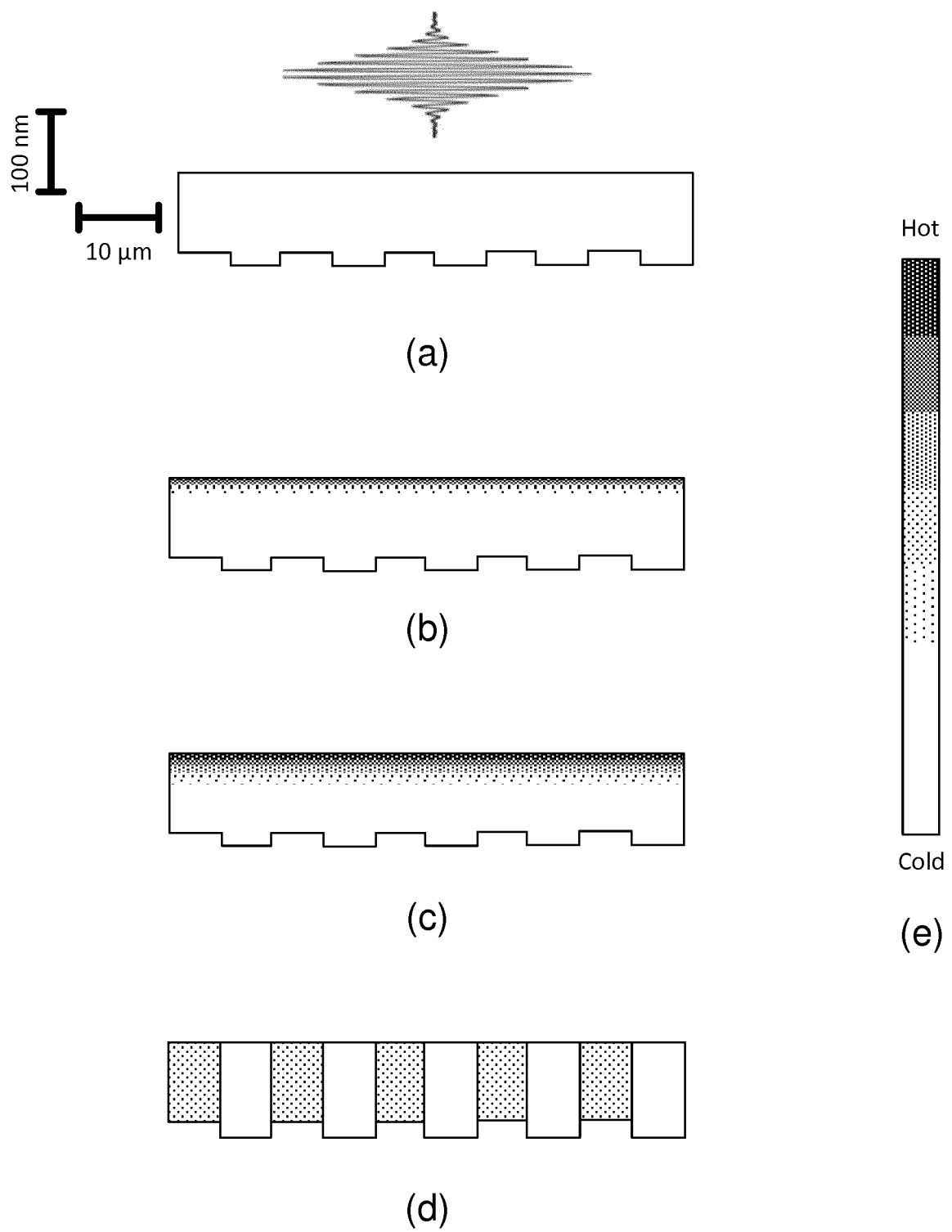
FIG. 13 illustrates a principle of a fifth aspect of the invention utilizing diffusion contrast of 'hot' electrons that are excited by femtosecond laser pulse(s), where (a) shows the excitation laser beam strike a metal layer, (b) shows the creation of 'hot' electrons at the optical skin depth, (c) shows the diffusion of 'hot' electrons into the metal, (d) shows a spatial electron temperature gradient at the top surface of the metal layer due to different diffusion volumes caused by the structure and (e) shows a color-coded temperature scale between 'hot' and 'cold'.
Figure 14:
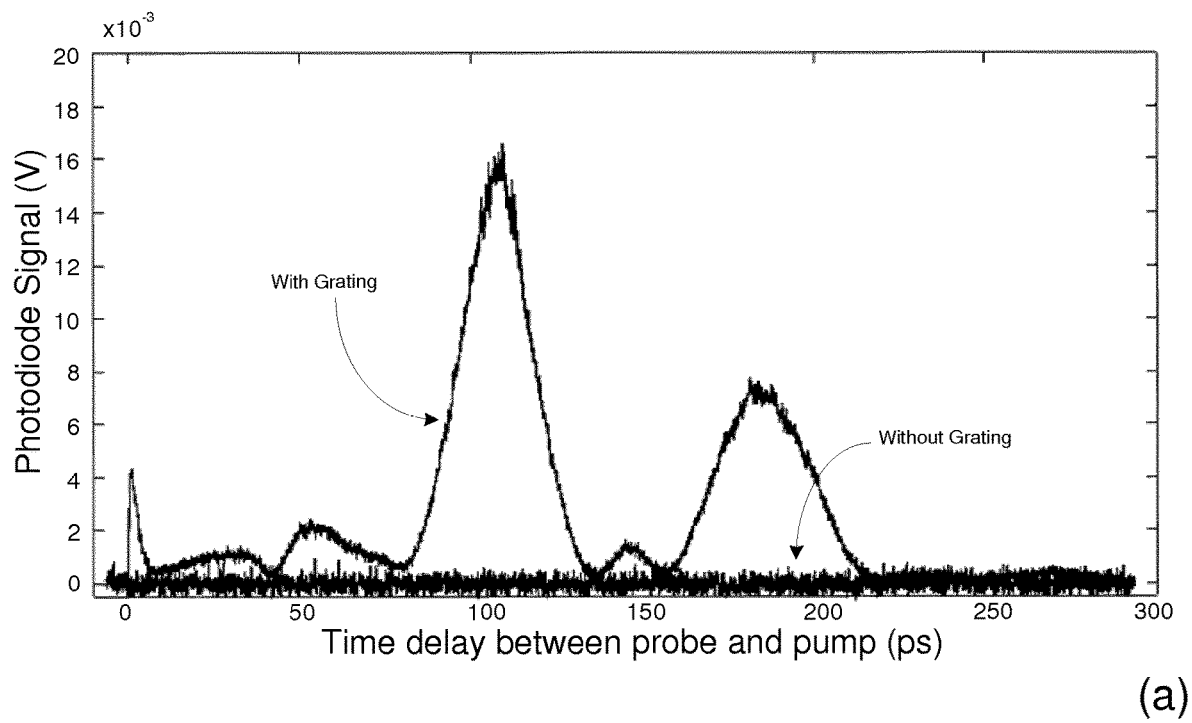
FIG. 14 illustrates (a) results of a 'proof of principle' experiment on a 100 nm gold layer with a 40 nm gold grating on top while excitation and measurement beams are applied from the glass substrate side, and (b) a simplified schematic illustration of the experiment set-up.
Figure 14:
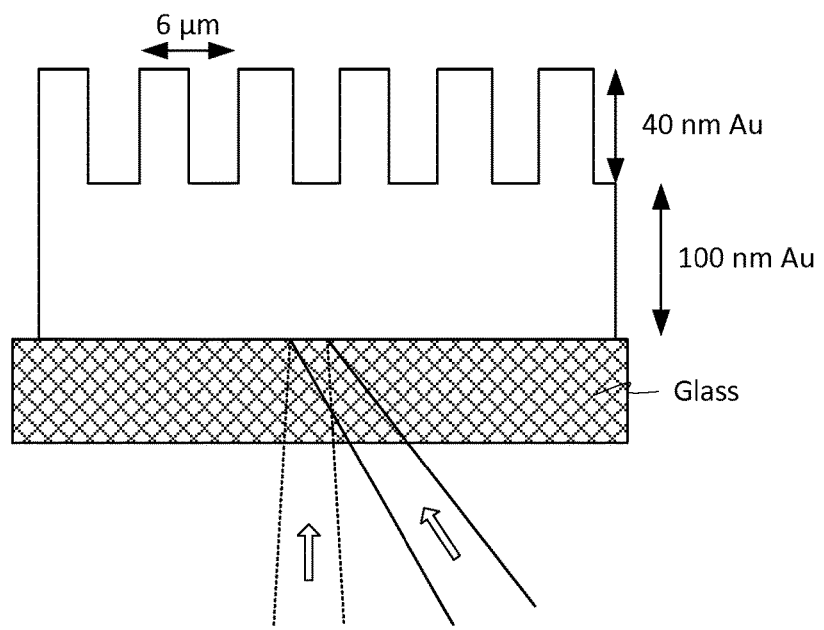

Referring now to FIGS. 13 and 14, another exemplary method and apparatus for measuring a structure on a substrate is discussed in accordance with a fifth aspect of the present invention.

This embodiment of the present invention utilises diffusion contrast of hot electrons excited by femtosecond laser pulses to detect a buried structure on a substrate. Here, the speed of diffusion of hot electron energy out of a region near the surface (determined by the optical skin depth) is influenced by the thickness of the metal (e.g. metal A) and by the presence of another metal (e.g. metal B, which may be the same metal material as metal A) that is buried within or underneath, but which is in contact with metal A. FIG. 13 shows a simplified illustration of the fifth embodiment, where (a) an excitation beam (e.g. femtosecond laser pulses) strikes the metal (e.g. metal A), (b) hot electrons are then generated at the optical skin depth, (c) the hot electron energy diffuses into the metal (e.g. metal A) and (d) a spatially periodic electron temperature gradient is caused at the top surface due to different diffusion volumes above the 'valleys' and 'ridges' of the grating. FIG. 13(e) is a color-coded temperature scale between 'hot' and 'cold'.

Following are a few application examples of the embodiment of the fifth aspect of the present invention.

(iv) Example—Alignment

The embodiment of the fifth aspect of the present invention is adapted to localize the position of a buried alignment grating. The hidden grating will cause a spatially periodic electron temperature at the top surface (see FIG. 13(d)). FIG. 14(a) shows the results of a 'proof of principle' experiment on a 100 nm gold layer with a 40 nm gold grating on top while exciting and measuring from the glass substrate side. In the areas with the gold grating, a diffraction signal was observed due to this electron temperature contrast. The spike near zero time delay is due to this contrast. Later in time, acoustic echoes are observed. The diffraction efficiency of the electronic contrast peak is $5 \times 10^{-8}$.

(v) Example—Defect Inspection

The embodiment of the fifth aspect of the present invention is adapted to detect the presence of defects in a metal. The presence of a defect in a metal may result in a change in electron temperature distribution at the surface. Thus, defects of sub-wavelength dimension may be detected with this technique.

(vi) Example—Electrical Contact Inspection

The embodiment of the fifth aspect of the present invention is adapted to inspect electrical contacts and electrical insulations. An intact electrical contact between two metals enables the transfer of electron energy from one metal to the other metal. This affects the electron energy diffusion, which in turn, changes the electron temperature at the top surface. This technique is much faster than using, for example, high energy electrons for checking electrical contacts. An optical excitation-measurement type sensor may also be more cost effective and is also capable of inspecting larger areas.

(vii) Example—Overlay Through Metal Layers

The embodiment of the fifth aspect of the present invention is adapted to be employed, for example, in a system such as Yieldstar (ASML) to measure the overlap between the resist grating and the buried target grating. The electron temperature contrast can give the position of the underlying grating and, by comparing this with the diffracted signal from the resist grating, provide the overlay.

It will be appreciated that the specific exemplary implementations described above are for exemplary purposes only. Alternate implementations may be envisaged within the scope of the present disclosure, some of which have additional or alternative technical benefits or advantages.

Purely by way of example, interferometric detectors, using a reference arm, may be used instead or in combination with of CCD-based detectors. Interferometric detection may in some examples enable to separately measure surface displacement and refractive index contributions to the surface effect, thereby increasing the sensitivity of the detector and/or the signal strength relative to the detector noise.

Similarly, radiation may be provided as a narrow-beam or spot scanning system, wherein one or both of the excitation or illumination radiation is focused to a radiation spot and spatially scanned across the surface of the substrate.

Furthermore, in addition to or as an alternative to a conventional optical system, using lens-based optical components, a lensless optical system may be envisaged. In such an implementation, illumination radiation provided to the surface of the substrate is scattered into a diffraction pattern that may be received at a suitable detector. In such an example, suitable phase retrieval algorithms may be employed during the derivation step to derive a structure based on the received diffraction patterns. In some such examples, additional algorithms and/or derivation steps may be employed to perform further corrections (e.g. aberration correction) and/or resolution improvement.

It will be appreciated that the radiation detection systems shown in the preceding specific exemplary implementations of the measurement apparatus are exemplary only. It will further be appreciated that alternative radiation detection systems may be envisaged and implemented. In various examples, the detector is one of: an interferometer; a dark-field detector; a differential detector; a lensless detection system; a single pixel detector; a phase contrast detector; or a CCD detector.

In an embodiment, there is provided a method for measuring a structure on a substrate, the structure being located beneath at least one layer deposited on the substrate, the method comprising: illuminating an excitation area of the substrate with excitation radiation at an excitation time, wherein the excitation radiation causes a material effect to interact with the substrate, and wherein the excitation radiation forms a spatial pattern on a surface of the substrate; measuring at least one effect associated with a scattered material effect scattered by the structure; and deriving at least one characteristic of the structure based on the measured at least one effect.

In an embodiment, the measuring comprises: illuminating the substrate with measurement radiation; and receiving scattered measurement radiation scattered by the substrate, wherein the scattered measurement radiation is representative of the at least one effect. In an embodiment, receiving scattered measurement radiation comprises using a detector, wherein the detector is one of: an interferometer; a darkfield detector; a differential detector; a lensless detection system; a single pixel detector; a phase contrast detector; or a CCD detector. In an embodiment, the excitation radiation comprises at least a first excitation beam, and wherein the step of illuminating the substrate with excitation radiation comprises using a radiation forming element so as to cause the at least first excitation beam to form the spatial pattern on a surface of the substrate. In an embodiment, the at least one effect on the surface of the substrate comprises at least one of: a physical displacement of the surface of the substrate; or a change in at least one optical property of the surface of the substrate, or a change in at least one physical quantity of the surface of the substrate. In an embodiment, the at least one effect is formed as a spatially periodic pattern on the surface of the substrate. In an embodiment, the at least one effect is a transient pattern on the surface of the substrate. In an embodiment, the transient pattern is a diffraction pattern of at least a portion of the structure. In an embodiment, the step of measuring comprises: illuminating the substrate with measurement radiation at one or more predetermined time interval(s) from the excitation time, and receiving scattered measurement radiation scattered by the substrate at each one of the one or more predetermined time interval(s), wherein the scattered measurement radiation is representative of the transient pattern at respective one or more predetermined time interval(s). In an embodiment, the transient pattern is a spatially period pattern. In an embodiment, the substrate is illuminated with measurement radiation at one or more predetermined portion(s) of the excitation area. In an embodiment, the excitation radiation is configured to generate a diffraction effect directly corresponding to a periodic pattern of the structure. In an embodiment, the material effect is an acoustic wave. In an embodiment, the material effect is a thermal diffusion. In an embodiment, the at least one characteristic of the measurement radiation may be chosen in dependency on one or more characteristics or material properties of at least one layer of the substrate.

In an embodiment, there is provided a lithographic apparatus, comprising means for performing a method as described herein. In an embodiment, there is provided a lithographic system comprising a lithographic apparatus as described herein.

In an embodiment, there is provided a method of manufacturing devices, wherein device features are formed on a series of substrates by a lithographic process using a lithographic apparatus, and wherein properties of the substrates are measured using a method as described herein, and wherein the measured properties are used to adjust parameters of the lithographic process.

In an embodiment, there is provided a computer program product containing one or more sequences of machine-readable instructions for implementing a method as described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms 'wafer' or 'die' herein may be considered as synonymous with the more general terms 'substrate' or 'target portion', respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms 'radiation' and 'beam' used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term 'lens', where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

Alternative applications for the invention are also possible. An example of such an application may be use for quality control in processes in which thin layers are being used. Applying opaque layers the invention may be used to detect defects and/or flaws in a substrate below the opaque layer. Taking this further it may be used to determine quality of adhesives or other materials.

Another example of an alternative application may be to ensure safety of certain valuable objects and/or documents, such as banknotes or passports. It would offer the possibility to add structures that are not visible to the eye, because they are hidden below layer.

Yet, in another example, compact information carriers can be provided that are read out using the method according to the invention.

The descriptions above are intended to be illustrative, not limiting. Thus, it will be apparent to one skilled in the art that modifications may be made to the invention as described without departing from the scope of the claims set out below.

The invention claimed is:

1. A method for measuring a structure on a substrate, the structure being located beneath at least one layer deposited on the substrate, the method comprising:
    illuminating an excitation area of the substrate with excitation radiation at an excitation time, wherein the excitation radiation causes a material effect to interact with the substrate, and wherein the excitation radiation forms a spatial pattern on a surface of the substrate;
    measuring at least one effect associated with a scattered material effect scattered by the structure; and
    deriving at least one characteristic of the structure based on the measured at least one effect.

2. The method according to claim 1, wherein the measuring comprises:
    illuminating the substrate with measurement radiation; and
    receiving scattered measurement radiation scattered by the substrate, wherein the scattered measurement radiation is representative of the at least one effect.

3. The method according to claim 2, wherein receiving scattered measurement radiation comprises using a detector, wherein the detector is selected from: an interferometer; a darkfield detector; a differential detector; a lensless detection system; a single pixel detector; a phase contrast detector; or a CCD detector.

4. The method according to claim 1, wherein the excitation radiation comprises at least a first excitation beam, and wherein the illuminating the substrate with excitation radiation comprises using a radiation forming element so as to cause the at least first excitation beam to form the spatial pattern on a surface of the substrate.

5. The method according to claim 1, wherein the at least one effect comprises at least one selected from: a physical displacement of the surface of the substrate, a change in at least one optical property of the surface of the substrate, or a change in at least one physical quantity of the surface of the substrate.

6. The method according to claim 5, wherein the at least one effect is formed as a spatially periodic pattern on the surface of the substrate.

7. The method according to claim 5, wherein the at least one effect is a transient pattern on the surface of the substrate.

8. The method according to claim 7, wherein the transient pattern is a diffraction pattern of at least a portion of the structure.

9. The method according to claim 7, wherein the measuring comprises:
   illuminating the substrate with measurement radiation at one or more predetermined time interval(s) from the excitation time, and
   receiving scattered measurement radiation scattered by the substrate at each one of the one or more predetermined time interval(s), wherein the scattered measurement radiation is representative of the transient pattern at respective one or more predetermined time interval(s).

10. The method according to claim 7, wherein the transient pattern is a spatially periodic pattern.

11. The method according to claim 9, wherein the substrate is illuminated with measurement radiation at one or more predetermined portion(s) of the excitation area.

12. The method according to claim 1, wherein the excitation radiation is configured to generate a diffraction effect directly corresponding to a periodic pattern of the structure.

13. The method according to claim 1, wherein the material effect is an acoustic wave.

14. The method according to claim 1, wherein the material effect is a thermal diffusion.

15. The method according to claim 2, wherein at least one characteristic of the measurement radiation is chosen in dependency on one or more characteristics or material properties of at least one layer of the substrate.

16. A method of manufacturing devices, wherein device features are formed on a series of substrates by a lithographic process using a lithographic apparatus, and wherein a property of at least one of the substrates is measured using the method of claim 1, and wherein the measured property is used to adjust a parameter of the lithographic process.

17. A non-transitory computer program product containing one or more sequences of machine-readable instructions therein, the instructions, upon execution by a computer system, configured to cause the computer system to at least:
   cause illumination of an excitation area of a substrate with excitation radiation at an excitation time, wherein the excitation radiation causes a material effect to interact with the substrate, and wherein the excitation radiation forms a spatial pattern on a surface of the substrate;
   cause measurement of at least one effect associated with a scattered material effect scattered by a structure on the substrate, the structure being located beneath at least one layer deposited on the substrate; and
   derive at least one characteristic of the structure based on the measured at least one effect.

18. The computer program product of claim 17, wherein the instructions configured to cause the measurement are further configured to cause:
   illumination of the substrate with measurement radiation; and
   detection of scattered measurement radiation scattered by the substrate, wherein the scattered measurement radiation is representative of the at least one effect.

19. The computer program product of claim 17, wherein the at least one effect comprises at least one selected from: a physical displacement of the surface of the substrate, a change in at least one optical property of the surface of the substrate, or a change in at least one physical quantity of the surface of the substrate.

20. A lithographic apparatus, comprising:
   a measurement system comprising an output to supply radiation and a detector configured to detect radiation; and
   the computer program product of claim 17.

* * * * *